United States Patent [19]
Good et al.

[11] Patent Number: 5,196,793
[45] Date of Patent: Mar. 23, 1993

[54] CRANKSHAFT POSITION VOLTAGE DEVELOPING APPARATUS HAVING A VOLTAGE CLAMP

[75] Inventors: Brian K. Good, Greentown; Mark B. Kearney, Kokomo; William P. Whitlock, Cicero; John R. Shreve, Kokomo, all of Ind.

[73] Assignee: Delco Electronics Corporation, Kokomo, Ind.

[21] Appl. No.: 735,026

[22] Filed: Jul. 24, 1991

[51] Int. Cl.$^5$ .................. H03K 5/08; G01B 7/30; G01P 3/44
[52] U.S. Cl. .................. 324/207.25; 123/617; 307/540; 307/564; 324/163; 324/207.15
[58] Field of Search .............. 324/160, 163, 166, 173, 324/174, 207.12, 207.15, 207.25; 307/540, 544, 555, 560, 564, 567; 328/1, 5; 123/617

[56] References Cited

U.S. PATENT DOCUMENTS

| | | | |
|---|---|---|---|
| 3,382,378 | 5/1968 | Akmenkalns | 307/567 |
| 3,937,988 | 2/1976 | DeClue et al. | 307/567 X |
| 4,027,177 | 5/1977 | Davis | 307/544 |
| 4,324,216 | 4/1982 | Johnson et al. | 123/415 |
| 4,926,073 | 5/1990 | Pigott et al. | 307/560 X |
| 5,015,879 | 5/1991 | Lasagna et al. | 328/5 X |

*Primary Examiner*—Gerard R. Strecker
*Attorney, Agent, or Firm*—Creighton R. Meland

[57] ABSTRACT

An apparatus for developing a signal voltage that represents the angular position of the crankshaft of an internal combustion engine. The apparatus includes a variable reluctance sensor that has a pick-up coil. The sensor is associated with means driven by the crankshaft of the engine for causing an alternating voltage to be induced in the pick-up coil as the crankshaft rotates. The apparatus includes a negative voltage clamp which clamps the voltage of a junction of the clamp circuit to substantially ground potential during negative half-cycles of the alternating voltage induced in the pick-up coil. The clamp circuit is adapted to be connected to a control circuit that is an integrated circuit having a bulk substrate diode. The clamp circuit prevents forward biasing of the bulk substrate diode.

4 Claims, 1 Drawing Sheet

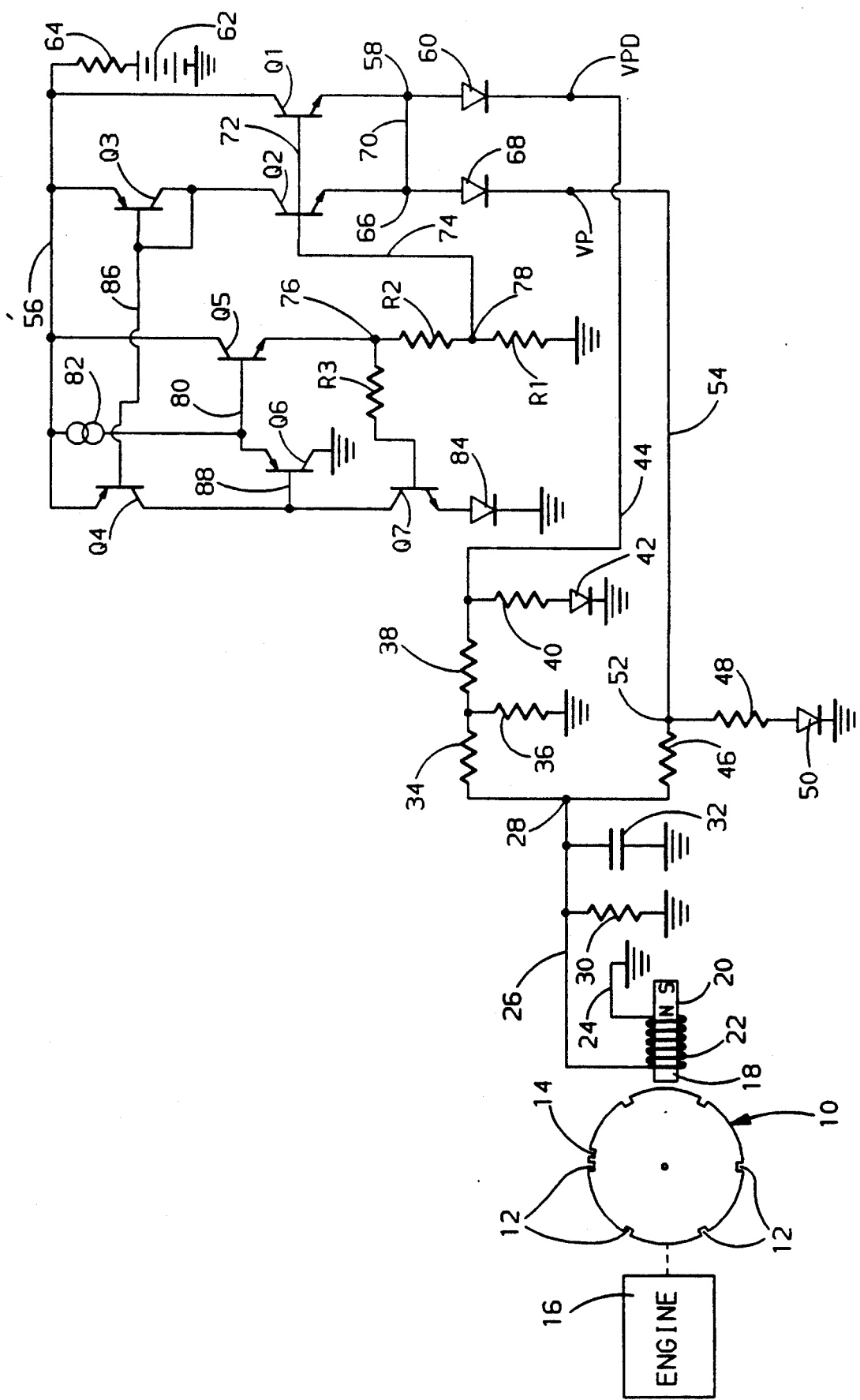

CRANKSHAFT POSITION VOLTAGE DEVELOPING APPARATUS HAVING A VOLTAGE CLAMP

This invention relates to a voltage generating apparatus for developing a voltage waveform related to the angular position of the crankshaft of an internal combustion engine that has a negative voltage clamp.

Variable reluctance sensors are used with ignition systems for internal combustion engines to develop signal voltages that represent engine crankshaft angular position. Thus, the sensor may cooperate with a wheel or disk driven by the crankshaft of the engine that has, for example, a plurality of angularly spaced slots. As a slot passes the sensor an alternating voltage is generated or induced in the pick-up coil of the sensor. Thus, as the wheel rotates consecutively occurring alternating voltages are generated at predetermined angular positions of the engine crankshaft.

As engine speed increases, the peak amplitude of the generated alternating voltage increases and in some systems the peak pick-up coil voltage both positive and negative may go as high as 200 volts.

In some electronic ignition systems the alternating voltage generated in the pick-up coil is applied to control circuits that are integrated circuits that have a bulk substrate diode. To ensure proper operation of an integrated circuit that has a bulk substrate diode, it is necessary to prevent forward biasing of the bulk substrate diode. It can be appreciated that if the negative half cycle of the generated pick-up coil alternating voltage is applied to an integrated circuit that has a bulk substrate diode, this diode will be forward biased and improper operation will occur.

It accordingly is an object of this invention to provide a control circuit that is connected to receive the alternating voltage generated in the pick-up coil of a variable reluctance engine crankshaft position sensor that develops a signal voltage for an integrated circuit that has a bulk substrate diode that does not forward bias the substrate diode during the occurrences of negative half-cycles of voltage generated in the pick-up coil. More specifically, the control circuit comprises a new and improved temperature compensated negative voltage clamp that will maintain the voltage at one or more terminals connected to the pick-up coil at substantially ground potential during the occurrence of a negative half-cycle of the alternating voltage induced in the pick-up coil.

IN THE DRAWINGS

The single FIGURE drawing illustrates a system made in accordance with this invention for developing an alternating voltage as a function of engine crankshaft position that has a negative voltage clamp.

Referring now to the drawing, the reference numeral 10 designates a slotted wheel which has seven radially extending slots. Six of the slots 12 are equally spaced by sixty angular degrees, and one of the slots 14 is spaced from another slot by ten angular degrees. The wheel 10 is driven by the crankshaft of an internal combustion engine 16.

A magnetic pick-up or variable reluctance sensor is disposed adjacent the outer periphery of wheel 10. A crankshaft position voltage is generated in the sensor as a slot passes by the end of the sensor. This sensor comprises a core 18, a permanent magnet 20 and a pick-up coil 22 wound on core 18. As a slot passes by an end of the sensor, an alternating voltage is induced in pick-up coil 22 in a manner well known to those skilled in the art.

One side of the pick-up coil 22 is connected to conductor 24 which is grounded. The opposite side of pick-up coil 22 is connected to conductor 26 which, in turn, is connected to a junction 28. A resistor 30 (15K) and a capacitor 32 (1000 pf) are respectively connected between conductor 26 and ground.

Junction 28 is connected to a circuit comprised of resistors 34, 36, 38 and 40 connected as shown. The resistance value of these resistors may respectively be 32.8K, 20K, 25K and 2.8K ohms. A p-n junction semiconductor diode 42 connects one end of resistor 40 to ground. The circuit that has just been described is connected to a conductor 44.

Junction 28 is also connected to a circuit comprised of resistors 46, 48 and a p-n junction semiconductor diode 50. Diode 50 is connected between resistor 48 and ground. The resistance values of resistors 46 and 48 may respectively be 40K and 4K ohms. The junction 52 is connected to a conductor 54.

The conductors 44 and 54 are connected to a temperature compensated negative voltage clamp circuit which will now be described. This clamp circuit has junctions or terminals VP and VPD. Junction VP is connected to conductor 54 and junction VPD is connected to conductor 44.

The voltage clamp circuit comprises an NPN transistor Q1 which has a collector connected to conductor 56. The emitter of transistor Q1 is connected to junction 58. A p-n junction semiconductor diode 60 is connected between junction 58 and junction VPD. This diode is in series with transistor Q1. The conductor 56 is connected to the positive side of a source of direct voltage 62 through a resistor 64. Voltage source 62 is the twelve volt storage battery on a motor vehicle. The negative side of voltage source 62 is connected to ground.

The voltage camp has a PNP transistor Q3 connected as a diode. The emitter of this transistor is connected to conductor 56 and its collector is connected to the collector of an NPN transistor Q2. The emitter of Q2 is connected to junction 66. A p-n junction semiconductor diode 68 is connected between junction 66 and terminal VP. Junctions 58 and 66 are connected by a conductor 70. The base electrodes of transistors Q2 and Q1 are connected by conductor 72 and they are also connected to conductor 74.

The voltage clamp has an NPN transistor Q5 the collector of which is connected to conductor 56. The emitter of Q5 is connected to a junction 76. Resistors R2 and R1 are series connected between junction 76 and ground. The junction 78 of these resistors is connected to conductor 74. The resistance values of resistors R2 and R1 may respectively be 2K and 12K ohms.

The voltage clamp further has a PNP transistor Q6 the collector of which is grounded. The emitter of Q6 is connected to the base of Q5 through conductor 80. A current source 82 is connected between conductor 56 and conductor 80.

The voltage clamp further includes PNP transistor Q4, NPN transistor Q7 and a p-n junction semiconductor diode 84. The base of Q4 is connected to the base of Q3 through conductor 86. The emitter of Q4 is connected to conductor 56. The collector of Q4 is connected to the collector of Q7 and to the base of Q6 through conductor 88. The diode 84 is connected between the emitter of Q7 and ground. The base of Q7 is connected to junction 76 by a resistor R3. Resistor R3 may have a resistance value of 10K ohms.

In the intended use of the system that has been described, the terminal VPD is adapted to be connected to a peak detector of an adaptive sense amplifier of a distributorless ignition system. The amplifier is an integrated circuit which has a bulk substrate diode. The clamp circuit prevents negative voltages generated in pick-up coil 22 from forward biasing the bulk substrate diode.

The terminal VP is to be connected to circuitry which develops square-wave pulses in response to the A.C. voltage developed in pick-up coil 22. It also is an integrated circuit having a bulk substrate diode and accordingly the voltage clamp will clamp the voltage at terminal VP to prevent forward biasing of the bulk substrate diode.

The peak amplitude of the A.C. voltage generated in pick-up coil 22 will vary with changes in engine speed. At high engine speed, this peak voltage may be as high as 200 volts. The positive half cycles are attenuated by the input circuit connected between the pick-up coil 22 and terminals VP and VPD. The negative half cycles are not attenuated and without the voltage clamp would forward bias bulk substrate diodes. The voltage clamp clamps the voltages at VP and VPD to near ground potential for negative voltages that may vary over a range of about −300 mV to −200 volts. As explained in more detail hereinafter, the voltages at VP and VPD are clamped to about 0.1 volts below ground. Because of the extreme negative voltage that needs to be clamped, the maximum clamp currents for VP and VPD are about 9.0 mA and 5.0 mA respectively. Therefore, the clamp circuit has a high dynamic current range along with little variation with changes in temperature.

In operation, clamp current is pulled through diodes 68 and 60 and is divided in a ratio specified by the physical areas of transistors Q1 and Q2. The portion of the current conducted by Q2 is mirrored at a ratio specified by the physical areas of Q3 and Q4.

The mirrored current from Q4 is then sourced through Q7 and diode 84 setting up a reference voltage at the base of Q7. This reference voltage equals the voltage drop across the base and emitter of Q7 added to the voltage drop across diode 84. This reference voltage is applied to junction 76 via resistor R3. The voltage divider comprised of resistors R2 and R1 attenuates the reference voltage so that the voltage at junction 78 follows the reference voltage but has a lower value than the reference voltage. Resistor R3 is chosen to correct for base current error.

The attenuated reference voltage at junction 78 which may be about 1.5 volts, is applied to the base electrodes of transistors Q2 and Q1 via conductor 74. The clamp voltages are determined by the base-emitter voltages of Q1 and Q2 and the voltage drops across diodes 68 and 60. Thus, the clamp voltage at terminal VP is related to base-emitter voltage of Q2 added to the voltage drop across diode 68 and the clamp voltage at terminal VPD is related to the base-emitter voltage of Q1 added to the voltage drop across diode 60. Assuming that the reference voltage on conductor 74 is 1.5 volts, the voltage drops across the base and emitter of Q2 and Q1 added to the respective voltage drops across diodes 68 and 60 causes the voltages at VP and VPD to be about 0.1 volt below ground. Thus, the clamp voltages at terminals VP or VPD are near ground potential.

The current density in the reference voltage developing stage of the clamp circuit is forced to match the current density in the output stage of the clamp circuit. By ratioing the device areas and currents as described, a means is provided of determining temperature characteristics as well as the desired clamp voltage. Two positive temperature terms, made up of $V_t$, which represents the thermal voltage of a p-n junction of transistors Q1 and Q2 and diodes 60 and 68, are set up against two negative temperature terms, made of the base-emitter voltage of transistor Q7 and the p-n junction of diode 84 attenuated by the resistor ratio of resistors R2 and R1.

Transistors Q5, Q6 and current source 82 make up the start-up circuit for the voltage clamp. The current level of current source 82 is crucial to the proper operation of the clamp circuit and has a significant effect on its dynamic range. Base current from Q6 provides the bias for the reference stack and at the same time is seen as a source of offset which can adversely effect the activation voltage of the clamp over temperature and manufacturing process. The NPN transistor Q5 is the source of base drive for Q1, Q2 and Q7 so while it is important to set the current level of the current source 82 as low as possible it needs to be high enough to drive Q5 sufficiently.

The ratioing of currents and device areas in the voltage clamp circuit provides an excellent control of the base-emitter voltages and the temperature characteristics of each transistor making it possible to choose the desired clamp voltage and temperature coefficient of the circuit.

The embodiments of the invention in which an exclusive property or privilege is claimed are defined as follows:

1. Apparatus for developing a signal voltage that represents the angular position of the crankshaft of an internal combustion engine, comprising in combination, a variable reluctance sensor having a pick-up coil, means driven by the crankshaft of said engine associated with said sensor for causing an alternating voltage to be induced in the pick-up coil of said sensor, a negative voltage clamp circuit connected to said pick-up coil for providing a voltage at a junction of said clamp circuit which is clamped substantially to ground potential during a negative half-cycle of said alternating voltage, a source of direct voltage having a positive terminal and a negative terminal connected to ground, said clamp circuit comprising a conductor connected to said positive terminal of said source of direct voltage, a series circuit connected between said conductor and said junction of said clamp circuit comprising the collector and emitter of a first NPN transistor and a first diode, said diode having an anode connected to said emitter of said first NPN transistor and having a cathode connected to said junction, means connecting said junction to one side of said pick-up coil, a reference voltage generating circuit connected across said voltage source comprising a second NPN transistor connected in series with a second diode, said reference voltage generating circuit developing a reference voltage at the base of said second transistor, and means connected to the base of said second NPN transistor and to the base of said first NPN transistor for applying a voltage to the base of said first transistor that follows the reference voltage developed at the base of said second transistor.

2. The apparatus according to claim 1 where the means for applying a voltage to be base of said first transistor that follows the reference voltage comprises a voltage divider that is connected to the base of said second transistor and to said base of said first transistor.

3. Apparatus for developing a signal voltage that represents the angular position of the crankshaft of an internal combustion engine, comprising in combination, a variable reluctance sensor having a pick-up coil, means driven by the crankshaft of said engine associated with said sensor for causing an alternating voltage to be induced in the pick-up coil of said sensor, a negative voltage clamp circuit connected to said pick-up coil for providing a voltage at first and second junctions of said clamp circuit which are clamped substantially to ground potential during a negative half-cycle of said alternating voltage, a source of direct voltage have a positive terminal and a negative terminal connected to ground, said clamp circuit comprising a conductor connected to said positive terminal of said source of direct voltage, a first series circuit connected between said conductor and said first junction of said clamp circuit comprising a first NPN transistor and a first diode, said first diode having an anode connected to said emitter of said first NPN transistor and having a cathode connected to said first junction, a second series circuit connected between said conductor and said second junction comprising a second NPN transistor and a second diode, said second diode having an anode connected to said emitter of said second NPN transistor and having a cathode connected to said second junction, means connecting one side of said pick-up coil to said first and second junctions, a reference voltage generating circuit connected across said voltage source comprising a third NPN transistor connected in series with a third diode, said reference voltage generating circuit developing a reference voltage at the base of said third transistor, and means connected to the base of said third transistor and to the bases of said first and second transistors for applying a voltage to the base of said first and second transistors that follows the reference voltage developed at the base of said third transistor.

4. The apparatus according to claim 3 where the means for applying a voltage to the bases of said first and second transistors that follows the reference voltage comprises a voltage divider that is connected to the base of said third transistor and to the bases of said first and second transistors.

* * * * *